(12) United States Patent
Akimoto

(10) Patent No.: US 12,362,208 B2
(45) Date of Patent: Jul. 15, 2025

(54) INSPECTION METHOD AND ETCHING SYSTEM

(71) Applicant: Tokyo Electron Limited, Tokyo (JP)

(72) Inventor: Takeshi Akimoto, Tokyo (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 427 days.

(21) Appl. No.: 17/846,040

(22) Filed: Jun. 22, 2022

(65) Prior Publication Data

US 2022/0406634 A1    Dec. 22, 2022

(30) Foreign Application Priority Data

Jun. 22, 2021  (JP) ................................ 2021-103004

(51) Int. Cl.
*H01L 21/67* (2006.01)
*H01L 21/3065* (2006.01)

(52) U.S. Cl.
CPC .... *H01L 21/67253* (2013.01); *H01L 21/3065* (2013.01); *H01L 21/67288* (2013.01)

(58) Field of Classification Search
CPC ... H01L 22/12; H01L 22/20; H01L 21/67253; H01L 21/67288
See application file for complete search history.

(56) References Cited

U.S. PATENT DOCUMENTS

2018/0156739 A1*  6/2018  Mori ................. H01L 21/67742
2021/0134684 A1*  5/2021  Ansell ............... H01J 37/32715

FOREIGN PATENT DOCUMENTS

| CN | 107046624 | * | 8/2017 | ............. H04N 5/265 |
| JP | 2002-190446 A | | 7/2002 | |
| JP | 2007-110079 A | | 4/2007 | |
| JP | 2017-003358 A | | 1/2017 | |

* cited by examiner

*Primary Examiner* — Walter H Swanson
(74) *Attorney, Agent, or Firm* — XSENSUS LLP

(57) ABSTRACT

There is provided a method of inspecting a substrate in an etching system including an imaging device, the method comprising: (A) imaging a substrate after plasma etching with the imaging device to acquire image data; and (B) calculating, based on the image data of the substrate after plasma etching, at least one selected from a group consisting of a dimension of a pattern on the substrate after plasma etching, information on a defect on the substrate after plasma etching, a thickness of a film on the substrate after plasma etching, and information on an appearance of the substrate after plasma etching.

17 Claims, 5 Drawing Sheets

INSPECTION METHOD AND ETCHING SYSTEM

CROSS-REFERENCE TO RELATED APPLICATIONS

This application claims priority to Japanese Patent Application No. 2021-103004 filed on Jun. 22, 2021, the entire contents of which are incorporated herein by reference.

TECHNICAL FIELD

The present disclosure relates to an inspection method and an etching system.

BACKGROUND

Japanese Laid-open Patent Publication No. 2002-190446 discloses a system including a coating and developing device and an etching device. This system includes a line width inspection device inspecting a development line width or an etching line width, a film thickness measurement unit measuring a thickness of a resist film, and a defect inspection device inspecting a surface defect after development or a surface defect after etching.

SUMMARY

The technique according to the present disclosure is directed to inspecting a plurality of inspection items including a dimension of a pattern on a substrate, which relates to a substrate after plasma etching, with high throughput.

In accordance with an example of the present disclosure, there is provided a method of inspecting a substrate in an etching system including an imaging device, the method comprising: (A) imaging a substrate after plasma etching with the imaging device to acquire image data; and (B) calculating, based on the image data of the substrate after plasma etching, at least one selected from a group consisting of a dimension of a pattern on the substrate after plasma etching, information on a defect on the substrate after plasma etching, a thickness of a film on the substrate after plasma etching, and information on an appearance of the substrate after plasma etching.

DETAILED DESCRIPTION

Figure 1:
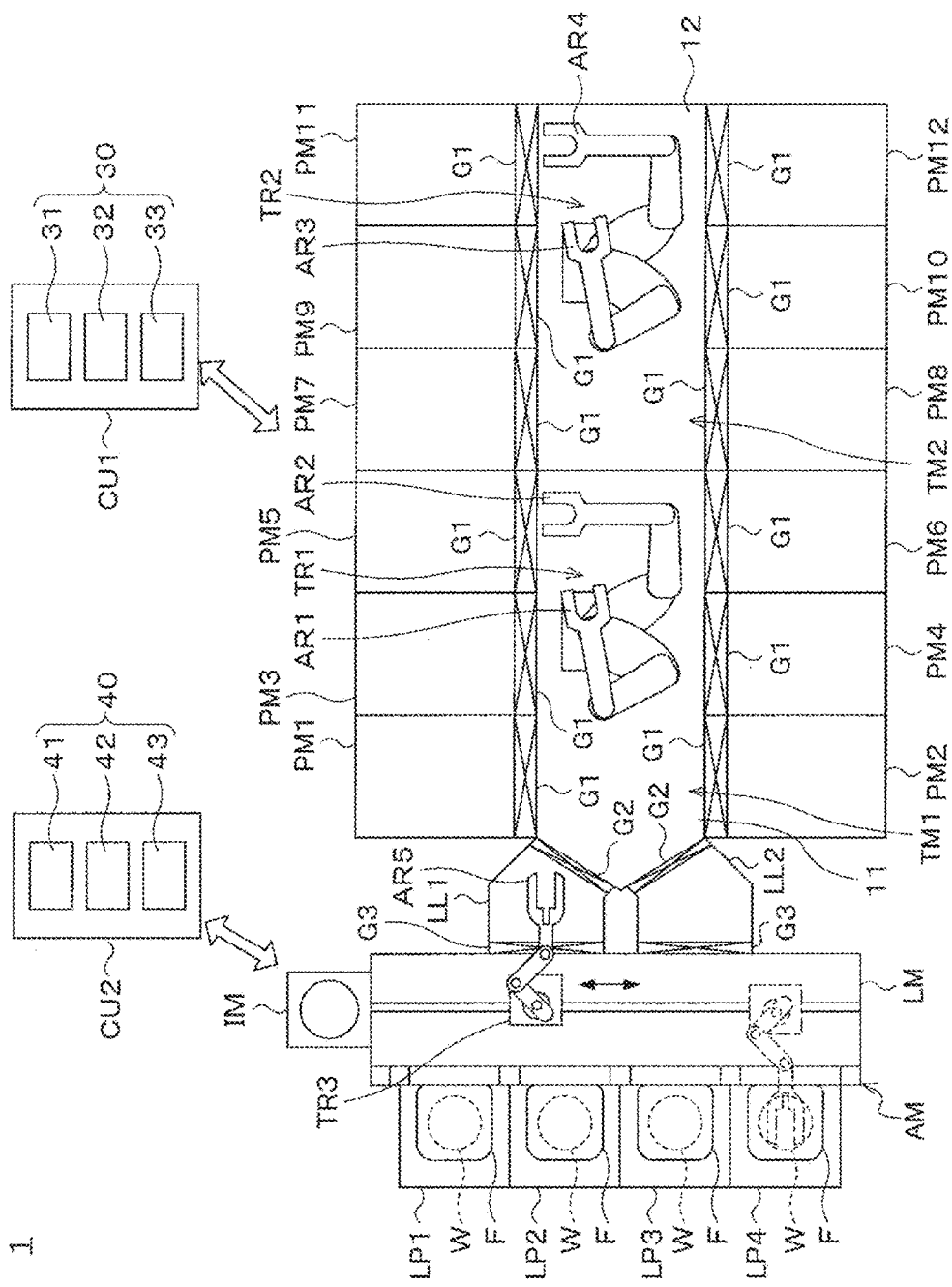
FIG. 1 is a view schematically illustrating an etching system according to an embodiment.

In a manufacturing process of a semiconductor device, etc., etching using plasma, i.e., plasma etching, is performed on a substrate, such as a semiconductor wafer (hereinafter, referred to as a "wafer").

The plasma etching affects a processing performed on the substrate afterwards or affects the performance of the semiconductor device. Therefore, it is important to inspect a state of the substrate after the plasma etching. Inspection items for the substrate after plasma etching may include a dimension of a pattern on the substrate (a line width, a hole diameter, etc.), which is generally considered important, but other inspection items such as a film thickness, a defect, appearance, etc. are also important. However, if inspections are performed for the respective inspection items with different devices, throughput may be lowered.

Therefore, the technique according to the present disclosure enables inspection of a plurality of inspection items including the dimensions of a pattern on a substrate after plasma etching, with high throughput.

Hereinafter, an inspection method and an etching system according to an embodiment are described with reference to the accompanying drawings. In addition, in the present specification and drawings, a repeated description may be omitted by giving the same reference numerals to the components having the substantially same functions.

<Etching System>

FIG. 1 is a view schematically illustrating a configuration of an etching system according to an embodiment.

An etching system 1 of FIG. 1 performs plasma etching on a wafer W as a substrate. The etching system 1 includes vacuum transfer modules TM1 and TM2, plasma etching modules (hereinafter, referred to as etching modules) PM1 to PM12 as etching devices, load-lock modules LL1 and LL2, a standby transfer module AM, and an imaging module IM for inspection, etc.

The vacuum transfer modules TM1 and TM2 have decompression transfer chambers 11 and 12 defined by housings having a substantially polygonal shape (a substantially rectangular shape in the example of the drawing), respectively, in a plan view.

In the decompression transfer chamber 11, the etching modules PM1 to PM6 are connected to two opposing sides. Among the other two opposing sides of the decompression transfer chamber 11, one side is connected to the load-lock modules LL1 and LL2, and the other side is connected to a path (not shown) for connecting to the decompression transfer chamber 12 of the vacuum transfer module TM2.

In the decompression transfer chamber 12, the etching modules PM7 to PM12 are connected to two opposing sides. A path (not shown) for connecting to the decompression transfer chamber 11 of the vacuum transfer module TM1 is connected to one of the other two opposing sides of the decompression transfer chamber 12.

Vacuum transfer mechanisms TR1 and TR2 configured to be capable of transferring the wafer W are arranged inside the decompression transfer chambers 11 and 12, respectively, maintained in a decompressed atmosphere. The vacuum transfer mechanisms TR1 and TR2 have transfer arms AR1 to AR4 to hold the wafer W when the wafer W is being transferred. The transfer arms AR1 to AR4 are configured to be rotated, expanded, contracted, and lifted freely.

The vacuum transfer mechanism TR1 transfers the wafer W between the load-lock modules LL1 and LL2, the etching modules PM1 to PM6, and the path (not shown) using, for example, the transfer arms AR1 and AR2.

Also, the vacuum transfer mechanism TR2 transfers the wafer W between the etching modules PM7 to PM12 and the path (not shown) using, for example, the transfer arms AR3 and AR4.

Each of the etching modules PM1 to PM12 performs plasma etching on the wafer W. Further, each of the etching modules PM1 to PM12 is connected to the vacuum transfer modules TM1 and TM2 via a gate valve G1.

The load-lock modules LL1 and LL2 are provided to connect the vacuum transfer module TM1 and the standby transfer module AM (specifically, a loader module LM to be described later) via gate valves G2 and G3. The load-lock modules LL1 and LL2 are configured to temporarily hold the wafer W. Moreover, the load-lock modules LL1 and LL2 are configured so that the inside may be switched between an atmospheric pressure atmosphere and a decompressed atmosphere.

The standby transfer module AM has the loader module LM including a transfer mechanism TR3, which will be described later, and load ports LP1 to LP4 on which a front-opening unified pod (FOUP) F is mounted. The FOUP F is a container in which a plurality of wafers W may be kept. In addition, the standby transfer module AM may further include an orienter module (not shown) adjusting a horizontal direction of the wafer W or the like.

The loader module LM has a housing having a rectangular shape viewed in a plan view, and the inside of the housing is maintained at atmospheric pressure. A plurality of load ports LP1 to LP4 (four load ports in the example of the figure) are provided side by side on one side constituting a longer side of the housing of the loader module LM. The load-lock modules LL1 and LL2 are provided side by side on the other side constituting a longer side of the housing of the loader module LM.

The transfer mechanism TR3 configured to transfer the wafer W is provided inside the housing of the loader module LM. The transfer mechanism TR3 has a transfer arm AR5 to hold the wafer W when the wafer W is being transferred. The transfer arm AR5 is configured to be movable in a longitudinal direction of the housing of the loader module LM and is configured to be rotated, expanded and contracted, and lifted freely.

The transfer mechanism TR3 transfers the wafer W between the FOUP F on the load ports LP1 to LP4, the load-lock modules LL1 and LL2, and the imaging module IM for inspection using, for example, the transfer arm AR5.

The imaging module IM is, for example, connected to one side constituting a shorter side of the housing of the loader module LM. The imaging module IM images, i.e., performs imaging on, the wafer W to inspect the wafer W. A specific configuration of the imaging module IM will be described later.

Further, the etching system 1 has a main control device CU1 and an inspection control device CU2. In an embodiment, the inspection control device CU2 performs control for a process related to the imaging module IM, among various processes described in the present disclosure, and the main control device CU1 performs control for other processes. Further, in an embodiment, the main control device CU1 and the inspection control device CU2 process computer-executable instructions for causing the etching system 1 to execute various processes described in the present disclosure. The main control device CU1 and the inspection control device CU2 may be configured to control each of the other elements of the etching system 1 to execute various processes described herein. In an embodiment, a part or all of the main control device CU1 and the inspection control device CU2 may be included in other elements of the etching system 1. For example, the main control device CU1 and the inspection control device CU2 may include computers 30 and 40, respectively. The computers 30 and 40 may include, for example, central processing units (CPUs) 31 and 41, storages 32 and 42, and communication interfaces 33 and 43. The CPUs 31 and 41 may be configured to perform various control operations based on programs stored in the storages 32 and 42. The storages 32 and 42 may include a random access memory (RAM), a read only memory (ROM), a hard disk drive (HDD), a solid state drive (SSD), or a combination thereof. The communication interfaces 33 and 43 may communicate with other elements of the etching system 1 via a communication line such as a local region network (LAN). Moreover, the main control device CU1 and the inspection control device CU2 may have a common computer. In other words, the main control device CU1 and the inspection control device CU2 may share a part or the entirety of the computer.

<Imaging Module IM>

Figure 2:
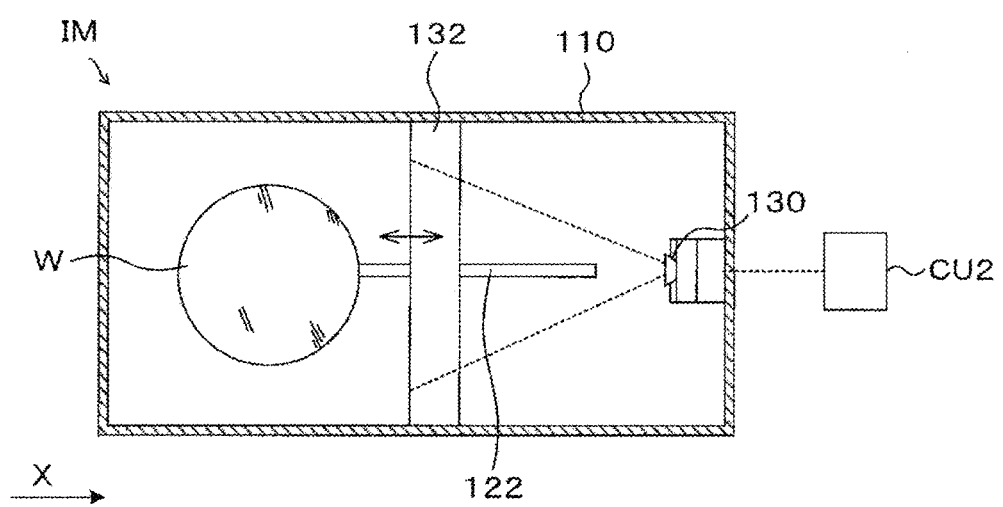
FIG. 2 is a cross-sectional view illustrating a schematic configuration of an imaging module.
Figure 3:
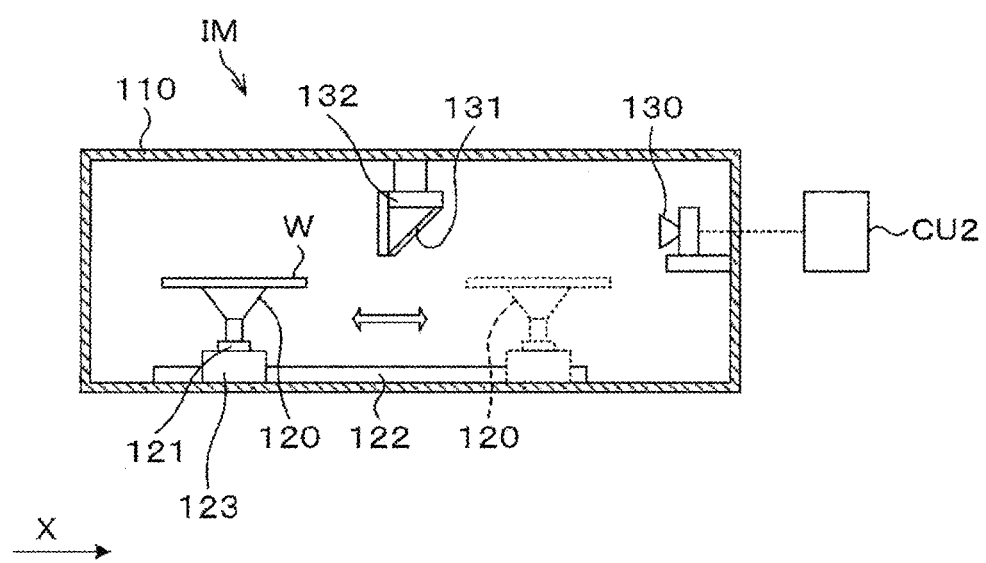
FIG. 3 is a longitudinal-sectional view illustrating a schematic configuration of an imaging module.

Next, the imaging module IM is described with reference to FIGS. 2 and 3. FIG. 2 is a cross-sectional view illustrating a schematic configuration of an imaging module IM. FIG. 3 is a longitudinal sectional view illustrating a schematic configuration of an imaging module IM.

The imaging module IM has a casing 110 as shown in FIG. 2. In the casing 110, a mounting table 120 on which the wafer W is mounted is provided as shown in FIG. 3. The mounting table 120 may be freely rotated and stopped by a rotation driving unit 121 such as a motor. A guide rail 122, which is elongated from one end side (a side in the X-axis negative direction in FIG. 3) to the other end side (a side in an X-axis positive direction in FIG. 3) within the casing 110, is provided at the bottom of the casing 110. The mounting table 120 and a rotation driving unit 121 are provided on the guide rail 122 and may move along the guide rail 122 by a driving unit 123.

An imaging device 130 is provided on a surface of the other end side within the casing 110 (the side in X-axis positive direction in FIG. 3). In the imaging device 130, for example, a wide-angle CCD camera is used. A half mirror 131 is provided near the upper center of the casing 110. The half-mirror 131 is provided at a position opposing the imaging device 130 in a state in which a mirror surface is inclined upward by 45 degrees in the direction of the imaging device 130 from a state in which the mirror surface faces vertically downward. A light source 132 is provided above the half mirror 131. The half mirror 131 and the light source 132 are fixed to an upper surface inside the casing 110. The light source 132 illuminates downward through the half mirror 131. Accordingly, a light reflected from an object in an irradiation region is further reflected by the half mirror 131 and is received by the imaging device 130. That is, the imaging device 130 may image an object in the irradiation region by the light source 132. Then, the captured image is input to the inspection control device CU2.

Figure 4:
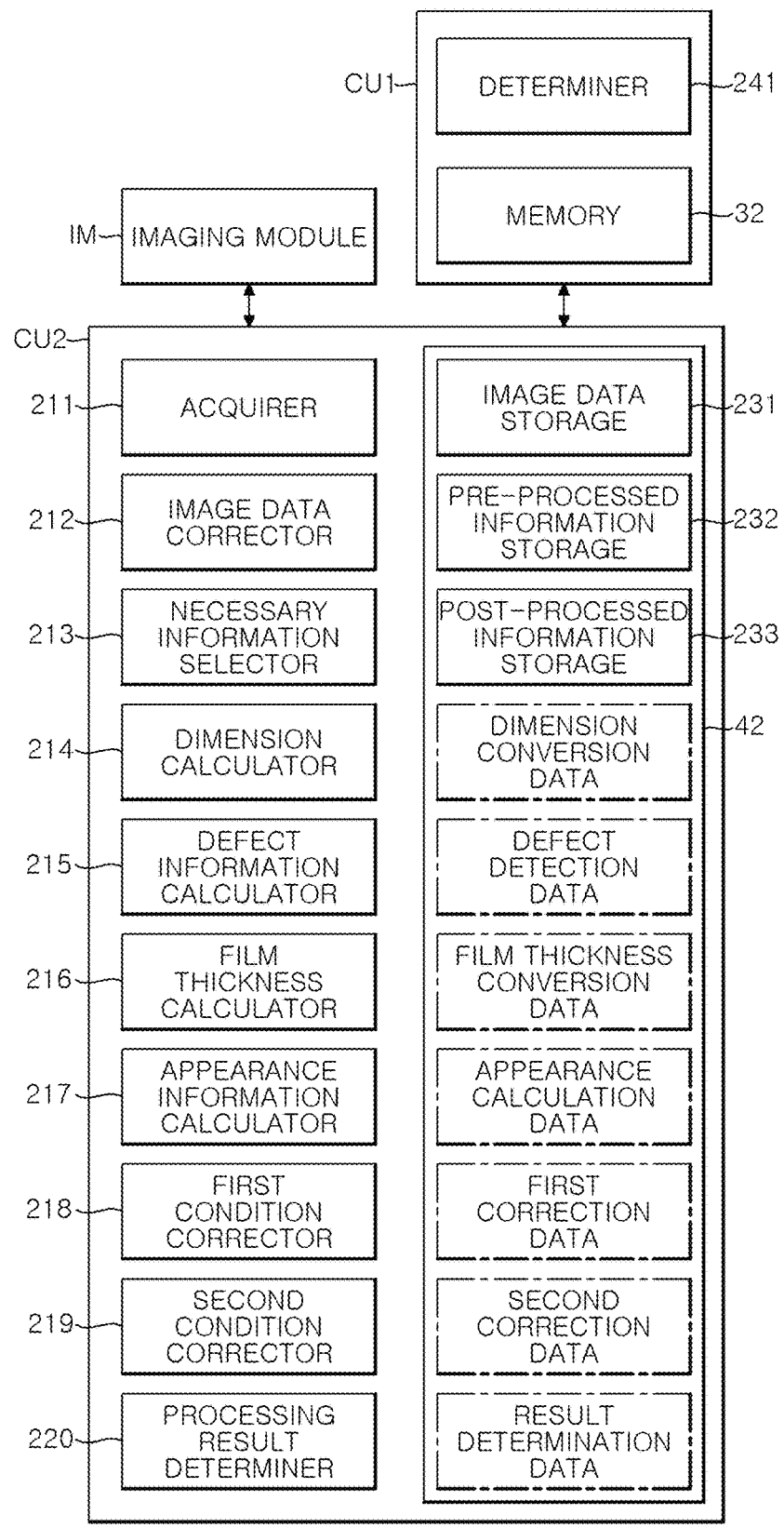
FIG. 4 is a functional block diagram of an inspection control device and a main control device related to inspection in an etching system.

In the imaging module IM, when the wafer W is moving along the guide rail 122 from one end side in the casing 110 to the other end side (from the X-axis negative direction side to the X-axis positive direction side in FIG. 4), the imaging device 130 intermittently performs imaging to capture an image of the entire surface of the wafer W. As a result, in the inspection control device CU2, image data of the entire surface of the wafer W is acquired.

<Inspection Control Device CU2 and Main Control Device CU1>

FIG. 4 is a functional block diagram of the inspection control device CU2 and the main control device CU1 related to inspection in the etching system 1.

As shown in FIG. 4, the inspection control device CU2 has an acquirer 211, an image data corrector 212, an necessary information selector 213, a dimension calculator 214, a defect information calculator 215, a film thickness calculator 216, an appearance information calculator 217, a first condition corrector 218, a second condition corrector 219, and a processing result determiner 220, which are implemented by a processor such as a CPU reading out and executing a program stored in the memory 42. In addition, the memory 42 of the inspection control device CU2 includes an image data storage 231, a pre-processed information storage 232, and a post-processed information storage 233.

The main control device CU1 has a determiner 241, which is implemented by a processor such as a CPU reading out and executing a program stored in the memory 32.

The acquirer 211 acquires image data of the wafer W, specifically, image data of the entire surface of the wafer W, based on an imaging result of the wafer W by the imaging module IM. The image data acquired by the inspection control device CU2 is, for example, RGB data representing luminance information of each of R (red), G (green), and B (blue) for each pixel. A color system other than an RGB color system, e.g., a CMYK color system, may also be used for the image data. The image data acquired by the inspection control device CU2 is stored in the image data storage 231.

The image data corrector 212 corrects the image data of the wafer W that is acquired by the acquirer 211 and used by the dimension calculator 214 and the like. The imaging result of the imaging device 130 may be affected by a change in intensity of a light exiting from the light source 132 of the imaging module IM over time or a state of the light source 132 (e.g., a temperature of the light source 132). Due to this, the image data corrector 212 corrects the image data of the wafer W acquired by the acquirer 211 based on, e.g., a usage time of the light source 132 of the imaging module IM or a temperature of the light source 132. For this correction, for example, a conversion table for converting a correction amount of the image data (specifically, a correction amount of a pixel value) depending on the usage time of the light source 132 or the temperature of the light source 132 is used. These conversion tables are calculated in advance and stored in the memory 42. In addition, for this correction, for example, a timer (not shown) for measuring the usage time of the light source 132 is provided in the inspection control device CU2, and a temperature sensor (not shown) for measuring the temperature of the imaging device 130 is provided in the imaging module IM.

The necessary information selector 213 selects an inspection item that needs to be inspected based on the image data of the wafer W, that is, information that needs to be calculated from the image data of the wafer W. This selection is made, for example, based on inspection information input from the main control device CU1, which will be described later.

The inspection according to the present embodiment is performed on at least a wafer W after plasma etching, among a wafer W before plasma etching and a wafer W after plasma etching, and may also be performed on a wafer W before plasma etching in some cases.

Therefore, the necessary information selector 213 may select an inspection item for at least the wafer W after plasma etching, and may also select an inspection item for the wafer W before plasma etching in some cases. The inspection items selected by the necessary information selector 213 may be partially or entirely common to the wafer W after plasma etching and the wafer W before plasma etching, or may be different from each other.

In addition, for the wafer W after plasma etching, the necessary information selector 213 may select at least one from a group consisting of, as an inspection item, a dimension of a pattern on the wafer W, information on defects on the wafer W, a film thickness on the wafer W, and information on the appearance of the wafer W.

The dimension calculator 214 calculates a dimension (specifically, a planar dimension) of the pattern on the corresponding wafer W, based on the image data of the wafer W. The dimension of the pattern is, for example, a line width in a case of a line-and-space pattern, and is, for example, a hole diameter in a case of a hole pattern. For calculation by the dimension calculator 214, dimension conversion data for converting the above dimension from luminance information of the image data of the wafer W is used. The dimension conversion data is acquired in advance and stored in the memory 42.

The defect information calculator 215 calculates i.e., acquires, defect information on the wafer W based on the image data of the wafer W. Specifically, the defect information calculator 215 calculates, for example, the number of defects on the surface of the corresponding wafer W based on, for example, the image data of the wafer W and defect detection data (data for detecting a defect based on the image data). More specifically, the defect information calculator 215 calculates, for example, a difference between each pixel of the wafer portion in the image data of the wafer W and a pixel adjacent thereto, i.e., differential data, detects micro-defects based on the differential data and the defect detection data, and calculates the number of the micro-defects. The defect information calculated by the defect information calculator 215 may include at least one selected from a group consisting of a size and a position of the micro-defects instead of or in addition to the number of micro-defects. In addition, the defect information may be obtained by indexing at least any two of the number, size, and position of the micro-defects based on the defect detection data. The defect detection data is acquired in advance and stored in the memory 42.

The film thickness calculator 216 calculates a thickness of a film on the wafer W based on the image data of the wafer W. Specifically, the film thickness calculator 216 calculates, for example, a thickness of an etching target layer on the corresponding wafer W or a film thickness of a mask pattern (e.g., a resist pattern) formed on the etch target layer based on the image data of the wafer W. For the calculation by the film thickness calculator 216, film thickness conversion data for converting the film thickness from the luminance information of the image data of the wafer W is used. The film thickness conversion data is acquired in advance and stored in the memory 42.

The dimension calculator 214, the defect information calculator 215, and the film thickness calculator 216 may calculate information corresponding to the dimension of the pattern for only a part of a region constituting the wafer W, based on the image data of the corresponding region.

In addition, the dimension calculator 214, the defect information calculator 215, and the film thickness calculator 216 may calculate information corresponding to the dimension of the pattern based on the image data of each region constituting the wafer W. In other words, the dimension calculator 214, the defect information calculator 215, and the film thickness calculator 216 may acquire an in-plane distribution of the corresponding information in the wafer W based on the image data of the wafer W.

The appearance information calculator 217 calculates, i.e., acquires, information on the appearance of the wafer W based on the image data of the wafer W. The information on the appearance of the wafer W calculated by the appearance information calculator 217 is, for example, information obtained by performing image processing on the image data of the entire surface of the wafer W. Specifically, the information on the appearance of the wafer W is obtained by multiplying each of a luminance value R, a luminance value G, and a luminance value B of the image data of the wafer W, that is, for example, RGB data by a predetermined coefficient determined for each color. Also, the information on the appearance of the wafer W may be information obtained by extracting a portion of the image data of the entire surface of the wafer W (for example, information obtained by extracting only image data of a specific chip). Also, the information on the appearance of the wafer W may be the image data of the wafer W acquired by the acquirer 211 or image data itself corrected by the image data corrector 212. Information necessary for calculation/acquisition of the information on the appearance of the wafer W by the appearance information calculator 217 (for example, the coefficient described above or a position of a portion to be extracted) is acquired in advance as appearance calculation data and stored in the memory 42.

The dimension calculator 214, the defect information calculator 215, the film thickness calculator 216, and the appearance information calculator 217 perform calculation/acquisition as described above on the wafer W after plasma etching. The information on the wafer W after plasma etching calculated/acquired by the dimension calculator 214, the defect information calculator 215, the film thickness calculator 216, and the appearance information calculator 217 is stored in the post-processed information storage 233.

In addition, the dimension calculator 214, the defect information calculator 215, the film thickness calculator 216, and the appearance information calculator 217 perform calculation/acquisition as described above on a wafer W before plasma etching in some cases. The information on the wafer W before plasma etching calculated/acquired by the dimension calculator 214, the defect information calculator 215, the film thickness calculator 216, and the appearance information calculator 217 is stored in the pre-processed information storage 232.

The dimension calculator 214, the defect information calculator 215, the film thickness calculator 216, and the appearance information calculator 217 as described above constitute a "calculator" according to the present disclosure.

The first condition corrector 218 determines whether a processing condition of plasma etching for the corresponding wafer W needs to be corrected based on the information on the wafer W before plasma etching calculated by the dimension calculator 214, the defect information calculator 215, the film thickness calculator 216, and the appearance information calculator 217. Specifically, for example, when the thickness of the etching target layer on the wafer W before plasma etching calculated by the film thickness calculator 216 is greater than a threshold, the first condition corrector 218 determines that the processing condition of plasma etching for the corresponding wafer W needs to be corrected.

Further, the first condition corrector 218 corrects the processing condition of plasma etching for the wafer W based on the information on the wafer W before plasma etching. Specifically, the first condition corrector 218 calculates, for example, a correction amount of the processing condition of plasma etching for the wafer W, based on the information on the wafer W before plasma etching. More specifically, when the thickness of the etching target layer on the wafer W before plasma etching calculated by the film thickness calculator 216 is larger than a threshold value, the first condition corrector 218 calculates a correction amount of a processing time so that the processing time of the plasma etching with respect to the wafer W is increased.

The etching system 1 corrects the processing condition of the plasma etching based on the correction amount calculated by the first condition corrector 218, and performs plasma etching on the corresponding wafer W under the corrected processing condition.

In other words, the first condition corrector 218 feeds forward information on the wafer W before plasma etching calculated by the dimension calculator 214, the defect information calculator 215, the film thickness calculator 216, and the appearance information calculator 217, for plasma etching by the etching system 1.

Data necessary for the first condition corrector 218 to determine whether or not the processing condition needs to be corrected and to calculate the amount of correction based on the information on the wafer W before plasma etching are acquired in advance and stored as first correction data in the memory 42. The first correction data includes, for example, a table in which inspection items (information), threshold values thereof, types of inspection items whose calculation result exceeds a threshold value, and types of processing conditions to be corrected are associated with each other, and a table in which calculation results of the inspection items and the calculation amount of the processing condition are associated with each other.

The second condition corrector 219 determines whether the processing condition of subsequent plasma etching for the wafer W needs to be corrected based on the information on the wafer W after plasma etching calculated by the dimension calculator 214, the defect information calculator 215, the film thickness calculator 216, and the appearance information calculator 217. Specifically, when the film thickness calculator 216 calculates the thickness of the resist pattern formed with respect to the etching target layer on the wafer W after plasma etching, the second condition corrector 219 may determine that the processing condition of subsequent plasma etching for the wafer W needs to be corrected when the thickness of the resist pattern does not fall within an allowable range.

Further, the second condition corrector 219 corrects the processing condition for subsequent plasma etching for the wafer W based on the information on the wafer W after plasma etching. Specifically, the second condition corrector 219 calculates, for example, a correction amount of the processing condition for subsequent plasma etching for the wafer W based on the information on the wafer W after plasma etching. More specifically, for example, when the film thickness calculator 216 calculates the thickness of the resist pattern formed on the etching target layer on the wafer W after plasma etching and the thickness of the resist pattern is less than a threshold value, the second condition corrector 219 calculates, based on the thickness, the correction amount of a corresponding processing time so that a processing time of subsequent plasma etching for the wafer W is reduced.

In addition, the second condition corrector 219 may determine whether the processing condition of subsequent plasma etching for the wafer W needs to be corrected based on a difference between information on the wafer W before plasma etching and after plasma etching calculated by the dimension calculator 214, the defect information calculator 215, the film thickness calculator 216, and the appearance information calculator 217. Specifically, when the film thickness calculator 216 calculates the thickness of the resist pattern formed on the etching target layer on the wafer W before and after plasma etching, the second condition corrector 219 determines as follows, for example. When a difference between the thicknesses of the resist pattern before and after plasma etching, that is, a reduction amount of the thickness, does not fall within an allowable range, the second condition corrector 219 determines that the processing condition of subsequent plasma etching for the wafer W needs to be corrected.

Further, the second condition corrector 219 may correct the processing condition of plasma etching for the subsequent wafer W based on the difference between information on the wafer W before and after plasma etching. Specifically, when the film thickness calculator 216 calculates the thickness of the resist pattern formed for the etching target layer on the wafer W before and after plasma etching, the second condition corrector 219 calculates a correction amount as follows. When the difference in the thickness of the resist pattern before plasma etching and after plasma etching, that is, a reduction amount, is smaller than a threshold value, the second condition corrector calculates, based on the reduction amount, the correction amount of the corresponding processing time so that a processing time of the plasma etching for the subsequent wafer W is reduced.

The etching system 1 corrects the processing condition of the plasma etching based on the correction amount calculated by the second condition corrector 219, and performs plasma etching on the corresponding wafer W under the corrected processing condition.

In other words, the second condition corrector 219 feeds back the information on the wafer W after plasma etching calculated by the dimension calculator 214, the defect information calculator 215, the film thickness calculator 216, and the appearance information calculator 217 to the plasma etching by the etching system 1.

Data necessary for the second condition corrector 219 to determine whether or not the processing condition needs to be corrected and to calculate the correction amount based on the information on the wafer W after plasma etching is acquired in advance as second correction data and stored in the memory 42. The second correction data includes, for example, a table in which the inspection items (information) used for the determination, a threshold value related thereto, the allowable range, and the types of inspection items lower than the threshold value and the types of processing condition to be corrected are associated with each other and a table in which the calculation result of the inspection item and the correction amount of the processing condition are associated with each other.

The processing result determiner 220 determines a result of the performed plasma etching based on the information on the wafer W after plasma etching calculated by the dimension calculator 214, the defect information calculator 215, the film thickness calculator 216, and the appearance information calculator 217. The processing result determiner 220 determines, for example, the result of plasma etching, that is, a level of performance, based on at least one selected from a group consisting of the information on the wafer W after plasma etching calculated by the dimension calculator 214, the defect information calculator 215, the film thickness calculator 216, and the appearance information calculator 217.

In the determination of the result of plasma etching by the processing result determiner 220, the information on the wafer W before plasma etching calculated by the dimension calculator 214, the defect information calculator 215, the film thickness calculator 216, and the appearance information calculator 217 may also be used. Specifically, for example, the processing result determiner 220 may determine the level of performance of the plasma etching based on a difference between the information on the wafer W before plasma etching and the information on the wafer W after plasma etching.

The dimension conversion data, defect detection data, film thickness conversion data, appearance calculation data, first correction data, second correction data, and result determination data described above may be stored in a plurality of types in the memory 42. For example, the dimension conversion data, the defect detection data, the film thickness conversion data, the appearance calculation data, the first correction data, the second correction data, and the result determination data stored in the memory 42 may be different for etching target layers depending on the types of the etching target layers.

Data necessary for the processing result determiner 220 to determine the result of plasma etching based on the information on the wafer W after plasma etching is acquired in advance as result determination data and stored in the memory 42. The result determination data includes, for example, a table in which an inspection item (information) used for determination, and the calculation result of the inspection item and a level are associated with each other.

The main control device CU1 acquires a processing recipe for a processing target wafer W in advance or at the start of processing when performing a wafer processing including inspection of the wafer W, and stores the acquired recipe in the memory 32. The processing recipe includes an inspection recipe. In the inspection recipe, for the target wafer W, for example, the following are preset, i.e., specified.

(1) Information on whether inspection is necessary before plasma etching (2) Inspection items required to be calculated in inspection after plasma etching (3) Inspection items which need to be calculated in inspection before plasma etching (set only when necessary)

(4) Region in which an inspection item is to be calculated in the wafer W (5) Data to be used for calculation of an inspection item (e.g., type of dimension conversion data, type of result determination data, etc.)

(6) First correction data to be used for the target wafer W (set only when necessary)

(7) Second correction data to be used for the target wafer W (set only when necessary)

(8) Result determination data to be used for the target wafer W (set only when necessary)

In addition, the determiner 241 of the main control device CU1 determines whether or not the inspection before plasma etching is necessary for the processing target wafer W, based on the inspection recipe included in the processing recipe set for the wafer W.

According to the result of this determination, the inspection before plasma etching by the inspection control device CU2 is performed.

<Wafer Processing>

Figure 5:
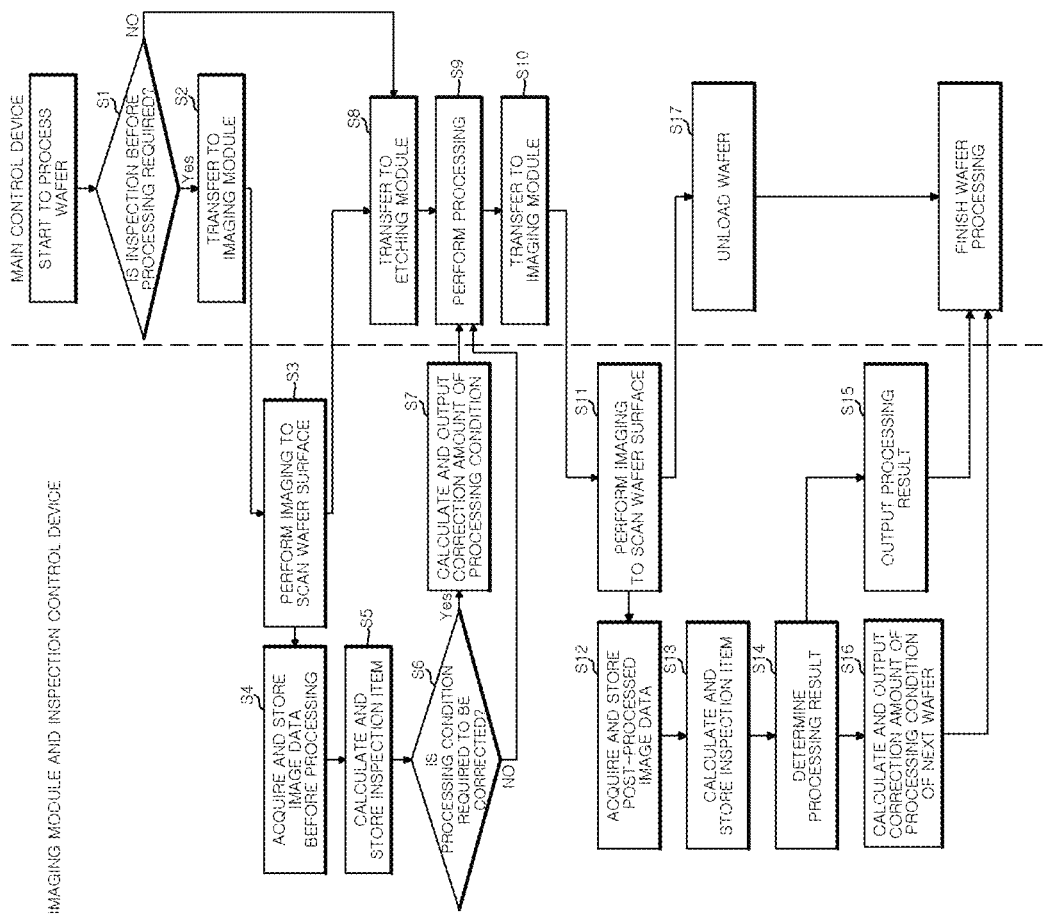
FIG. 5 is a flowchart illustrating an example of wafer processing including inspection of a wafer performed using an etching system.

Next, wafer processing including the inspection of the wafer W performed using the etching system 1 will be described with reference to FIG. 5. FIG. 5 is a flowchart illustrating an example of a wafer processing performed using the etching system 1.

(Step S1)

First, as shown in FIG. 5, whether an inspection before plasma etching is required for the processing target wafer W is determined by the determiner 241 of the main control device CU1.

This determination is performed, for example, based on the processing recipe set for the processing target wafer W.

An example of the processing target wafer W may be a wafer in which a silicon oxide layer and a resist layer are formed on the wafer surface in this order. In this wafer, for example, lines & spaces are formed in the oxide layer using the resist layer as a mask.

Another example of the processing target wafer W is a wafer in which a polysilicon layer and a resist layer are formed on the wafer surface in this order. In this wafer, for example, a gate is formed on the polysilicon layer using the resist layer as a mask.

(Step S2)

When it is determined that the inspection before plasma etching is unnecessary (in the case of NO), the process proceeds to step S8. On the other hand, when it is determined that the inspection before plasma etching is necessary (in the case of YES), an inspection before plasma etching is started for the processing target wafer W and the processing target wafer W is transferred to the imaging module IM for inspection. Specifically, the wafer W to be processed is taken out from the FOUP F by the transfer mechanism TR3 under the control of the main control device CU1, and transferred to the imaging module IM for inspection.

In addition, at this time, based on the processing recipe set for the processing target wafer W by the main control device CU1, for example, the following (3) to (6) are output to the inspection control device CU2 as inspection information before etching.

(3) Inspection item required to be calculated in inspection before plasma etching
(4) Region in which an inspection item is to be calculated in the wafer W
(5) Data to be used for calculation of an inspection item
(6) First correction data to be used for the target wafer W (Step S3)

Then, in the imaging module IM under the control of the inspection control device CU2, imaging by the imaging device 130 is performed so that a surface of the wafer W before plasma etching is scanned.

(Step S4)

Subsequently, the image data of the wafer W is acquired by the acquirer 211 of the inspection control device CU2 based on the imaging result of the wafer W before plasma etching by the imaging device 130, and stored in the image data storage 231.

The image data acquired and stored here is, for example, RGB data.

(Step S5)

Subsequently, the inspection control device CU2 calculates and stores information on an inspection item of the wafer W before plasma etching.

Specifically, an inspection item that needs to be inspected is selected by the necessary information selector 213 based on the information of (3) included in the inspection information before etching described above. In this manner, at least one from a group consisting of a dimension of a pattern on the wafer W, information on a defect on the wafer W, a thickness of a film on the wafer W, and information on an appearance of the wafer W is selected.

Then, the information on the selected inspection item is calculated based on the image data of the wafer W before plasma etching by the dimension calculator 214, the defect information calculator 215, the film thickness calculator 216, and the appearance information calculator 217, and is stored in the pre-processed information storage 232.

For example, the dimension of the pattern on the region is calculated as the dimension of the pattern on the wafer W before plasma etching by the dimension calculator 214 based on the image data of the region specified in the information of (4) and the dimension conversion data specified in the information of (5) included in the inspection information.

When a defect is selected as an inspection item that needs to be inspected, the number of defects of the entire surface of the wafer W is calculated as information of the defect on the wafer W before plasma etching by the defect information calculator 215 based on, for example, the image data of the entire wafer W and the defect detection data specified in the information of (5) included in the inspection data.

When a film thickness is selected as an inspection item that needs to be inspected, the thickness of the film on the region is calculated as a thickness of the film on the wafer W before plasma etching by the film thickness calculator 216 based on, for example, the image data of the region specified in the information of (4) and the film thickness conversion data specified in the information of (5) above included in the inspection information. When the film thickness of the resist pattern on the etching target layer is calculated, it may be calculated based on image data of a region that has a small number of formed openings and is mostly covered with the resist film. In the case where the film thickness of the etching target is calculated when the resist pattern is formed on the etching target layer, it may be calculated based on image data of the region where the etching target layer is exposed from the resist pattern, that is, the region corresponding to the opening portion of the resist pattern.

When an appearance is selected as an inspection item that needs to be inspected, image data obtained by extracting a portion of the image data of the wafer W is calculated as information of the appearance of the wafer W before plasma etching by the appearance information calculator 217 based on, for example, the appearance calculation data specified in the information of (5) above included in the inspection information.

The image data of the wafer W before plasma etching used for calculation of the information of the inspection item in step S5 may be data corrected by the image data corrector 212. The image data corrector 212 corrects the image data of the wafer W before plasma etching based on, for example, a measurement result of an accumulated usage time of the light source 132 by a timer (not shown) or a measurement result of a temperature of the light source 132 by a temperature sensor (not shown), and the conversion table described above.

(Step S6)

Then, based on the information on the inspection item calculated in step S5 by the first condition corrector 218, it is determined whether or not the processing condition for plasma etching on the processing target wafer W needs to be corrected.

Specifically, whether the processing target wafer W needs to be corrected is determined by the first condition corrector 218 based on the first correction data specified in the information of (5) included in the inspection item information calculated in step S5 and the inspection information before etching described above in step S5.

In addition, when the information of the inspection item calculated in step S5 shows an abnormal value (for example, when the number of defects exceeds a threshold value, or appearance data coincides with abnormal data, etc.), the processing after step S6 may be stopped, or the operation of the etching system 1 may be stopped and subsequent wafer processing for the wafer W may be stopped.

(Step S7)

If it is determined in step S6 that correction is unnecessary (in the case of NO), the process proceeds to step S9. When it is determined that correction is necessary (in the case of YES), a correction amount of the processing condition of plasma etching for the processing target wafer W is calculated by the first condition corrector 218 and output to the main control device CU1.

Specifically, a correction amount of the processing condition of plasma etching for the processing target wafer W is calculated by the first condition corrector 218 based on, for example, the first correction data specified in the information of (6) included in the inspection information before etching and the inspection item information calculated in step S5. The calculated correction amount is output to the main control device CU1. Thereafter, the process proceeds to step S9.

(Step S8)

For example, in step S8 that can be performed in parallel with steps S4 to S7 described above, the processing target wafer W is transferred from the imaging module IM for inspection to a desired etching module (herein, it is assumed to be transferred to the etching module PM1).

Specifically, under the control of the main control device CU1, the processing target wafer W is taken out from the FOUP F or the imaging module IM for inspection by the transfer mechanism TR3, and transferred, for example, to the load-lock module LL1. Thereafter, the processing target wafer W is taken out from the load-lock module LL1 by the vacuum transfer mechanism TR1 and transferred to the etching module PM1. Thereafter, the process proceeds to step S9.

(Step S9)

In step S9, plasma etching is performed on the processing target wafer W. In step S9, which is performed after the correction amount is calculated in step S7, plasma etching is performed on the processing target wafer W under the processing condition corrected based on the correction amount calculated in step S7. In addition, when it is determined in step S6 that correction is unnecessary or when it is determined in step S1 that the inspection before plasma etching is unnecessary, plasma etching is performed under a processing condition predetermined in the processing recipe in step S9.

(Step S10)

After plasma etching, inspection of the wafer W after plasma etching is started, and the wafer W is transferred to the imaging module IM for inspection.

Specifically, under the control of the main control device CU1, first, the wafer W after plasma etching is taken out from the etching module PM1 by the vacuum transfer mechanism TR1, and transferred, for example, to the load-lock module LL2. Then, the wafer W after plasma etching is transferred from the load-lock module LL2 to the imaging module IM for inspection by the vacuum transfer mechanism TR1.

In addition, for example, the following information (2), (4), (5), (7), and (8) are output to the inspection control device CU2 as inspection information after etching by the main control device CU1 based on the processing recipe set for the wafer W.

(2) Inspection items required to be calculated in inspection after plasma etching (4) Region in which an inspection item is to be calculated in the wafer W (5) Data to be used for calculation of an inspection item (7) Second correction data to be used for the target wafer W (8) Result determination data to be used for the target wafer W (Step S11)

Thereafter, in the imaging module IM, imaging is performed by the imaging device 130 to scan the surface of the wafer W after plasma etching under the control of the inspection control device CU2.

(Step S12)

Subsequently, the image data of the wafer W is acquired by the acquirer 211 of the inspection control device CU2 based on the imaging result of the wafer W after plasma etching by the imaging device 130, and is stored in the image data storage 231.

The image data acquired and stored here is, for example, RGB data.

(Step S13)

Subsequently, information on an inspection item of the wafer W after plasma etching is calculated and stored by the inspection control device CU2.

Specifically, an inspection item that needs to be inspected is selected by the necessary information selector 213 based on the information of (2) above included in the inspection information after etching described above. In this manner, at least one from a group consisting of the dimension of the pattern on the wafer W, information on a defect on the wafer W, the thickness of the film on the wafer W, and information on the appearance of the wafer W is selected.

Then, the information on the selected inspection item is calculated by a corresponding calculator among the dimension calculator 214, the defect information calculator 215, the film thickness calculator 216, and the appearance information calculator 217 based on the image data of the wafer W after plasma etching, and is stored in the post-processed information storage 233.

For example, the dimension of the pattern on the region is calculated as a dimension of the pattern on the wafer W after plasma etching by the dimension calculator 214 based on the image data of the region specified in the information of (4) included in the inspection information and the dimension conversion data specified in the information of (5).

When a defect is selected as an inspection item that needs to be inspected, the number of defects of the entire surface of the wafer W is calculated as information of the defect on the wafer W after plasma etching by the defect information calculator 215 based on, for example, the image data of the entire wafer W and the defect detection data specified in the information of (5) included in the inspection data.

When a film thickness is selected as an inspection item required to be inspected, a thickness of the film on the region is calculated as a thickness of the film on the wafer W after plasma etching by the film thickness calculator 216 based on, for example, the image data of the region specified in the information of (4) and the film thickness conversion data specified in the information of (5) included in the inspection information.

When an appearance is selected as an inspection item that needs to be inspected, image data obtained by extracting a portion of the image data of the wafer W is calculated as information of the appearance of the wafer W after plasma etching by the appearance information calculator 217 based on, for example, the appearance calculation data specified in the information of (5) included in the inspection information.

The image data of the wafer W after plasma etching used for calculation of the information of the inspection item in step S13 may be data corrected by the image data corrector 212.

(Step S14)

Subsequently, a result of plasma etching is determined by the processing result determiner 220 based on the information on the inspection item calculated in step S13.

Specifically, a result of plasma etching, that is, a level of performance, is determined by the processing result determiner 220 based on at least one selected from a group consisting of the information on the inspection items calculated in step S13.

In this determination, the difference between the information of the inspection item calculated in step S13 and the information of the inspection item calculated in step S5 corresponding to the information may be used. Thereby, a more accurate determination may be performed.

In addition, when the information of the inspection item calculated in step S13 indicates an abnormal value (for example, when the number of defects exceeds a threshold value or when appearance data coincides with abnormal data, etc.), the operation of the etching system 1 is stopped and a subsequent wafer processing for the wafer W may be stopped.

(Step S15)

The result of determining the plasma etching by the processing result determiner 220 is output to, for example, an external quality control server of the etching system 1.

(Step S16)

Further, a correction amount of the processing condition of subsequent plasma etching for the wafer W is calculated by the second condition corrector 219 and output to the main control device CU1.

Specifically, a correction amount of the processing condition of plasma etching for the subsequent wafer W is calculated by the second condition corrector 219 based on the second correction data specified in the information of (7) included in the inspection item information after etching and the inspection information calculated in step S13.

For this calculation, the difference between the information of the inspection item calculated in step S13 and the information of the inspection item calculated in step S5 corresponding to the information may be used. Thereby, a more suitable processing condition may be calculated.

(Step S17)

For example, in step S17 performed in parallel with steps S11 to S16 described above, the wafer W after plasma etching is unloaded from the etching system 1. Specifically, the wafer W after plasma etching is unloaded from the imaging module IM for inspection to the FOUP F by the transfer mechanism TR3 under the control of the main control device CU1.

Each of the above steps is performed for each wafer W.

As mentioned above, in the inspection according to the present embodiment, at least one selected from a group consisting of the dimension of the pattern on the wafer W after plasma etching, information on a defect on the wafer W after plasma etching, a thickness of a film on the wafer W after plasma etching, and information on the appearance of the wafer W after plasma etching is calculated based on the image data of the wafer W after plasma etching acquired based on the imaging result of the imaging module IM of the etching system 1. In other words, in the inspection according to the present embodiment, the image data of the wafer W after plasma etching used for calculation of information on each inspection item may be created from the results captured at the same timing by the same imaging module IM. Therefore, the wafer W is not needed to be transferred to different modules for each inspection. Accordingly, a plurality of inspection items including the dimension of the pattern on the wafer W related to the wafer after plasma etching may be inspected with high throughput.

In addition, in the present embodiment, for the same reason as for the wafer W after plasma etching, a plurality of inspection items related to the wafer W before plasma etching, including the dimension of the pattern on the wafer W, may be inspected with high throughput.

In addition, in the present embodiment, the image data used for calculation of the information of various inspection items is corrected by the image data corrector 212 based on the accumulated usage time of the light source 132, etc. Therefore, calculation of the dimension of the pattern on the wafer W after plasma etching, etc. may be performed more accurately. Therefore, the result of plasma etching may be determined more accurately.

In addition, in the present embodiment, the first condition corrector 218 calculates the processing condition for plasma etching of the processing target wafer W based on the calculation result of information on inspection items related to the wafer W before plasma etching. Accordingly, an appropriate plasma etching processing result may be obtained for the processing target wafer W.

Further, in the present embodiment, the second condition corrector 219 calculates the processing condition for plasma etching of the subsequent wafer W based on the calculation result of information on inspection items related to the wafer W after plasma etching. Accordingly, an appropriate plasma etching processing result may be obtained for the wafer W to be processed subsequently.

<Modification 1>

The wafer processing described with reference to FIG. 5 may be performed for each product wafer W, and the following may be automatically performed for a wafer W for inspection different from a product wafer W. That is, the process of acquiring image data of the inspection wafer W by imaging the inspection wafer W after plasma etching with the imaging module IM and the process of performing inspection on the inspection wafer W based on the image data of the inspection wafer after plasma etching may be performed automatically. By performing the inspection in this manner, the soundness as an etching system including etching characteristics may be ensured. In other words, it may be determined whether desired etching performance has been obtained.

The inspection wafer W is, for example, a wafer W in which only an etching target layer is formed and no mask pattern is formed. A plurality of inspection wafers W are accommodated in a specific FOUP F arranged above the load port LP1 or the like, for example.

In addition, a timing at which the aforementioned process related to the inspection wafer W is performed is determined by the main control device CU1 based on the following information, for example. In addition, the following information is stored in the memory 32, for example.

Pre-specified frequency (for example, number of processed wafers, number of processed lots, accumulated processing time, etc.)

A state of implementation of the maintenance of the etching system 1 (for example, information on whether or not maintenance was performed)

History of plasma etching on product substrates in the etching system 1 (for example, information on whether or not a processing condition in which a large amount of reaction products are generated is continuous or not)

Determination of whether or not the predetermined condition is satisfied is made, for example, in the main control device CU1, and information necessary for the determination is obtained in advance, for example, and stored in the memory 32.

In the step of inspecting the inspection wafer W based on the image data of the inspection wafer after plasma etching, for example, the information of the same inspection item as the product wafer W after plasma etching is calculated, for example, by the inspection control device CU2 for the inspection wafer W after plasma etching.

In addition, similarly to the plasma etching for the product wafer W, a process result of the plasma etching for the inspection wafer W may be determined. In this case, even the information of the inspection item for the inspection wafer W before plasma etching calculated based on the image data of the inspection wafer W before plasma etching, as well as the information of the inspection item for the inspection wafer W after plasma etching calculated based on the image data of the inspection wafer W after plasma etching, may be used to determine the processing result of plasma etching.

The inspection using the inspection wafer W may be performed for each etching module PM1 to PM12.

<Modification 2>

In the above embodiment, the "calculator" according to the present disclosure calculates at least one selected from a group consisting of the pattern dimension on the wafer W, information on the defect on the wafer W, the thickness of the film on the wafer W, and information on the appearance of the wafer W as an inspection item for the wafer W after plasma etching from image data of the wafer W after plasma etching. The "calculator" according to the present disclosure may further calculate a three-dimensional shape of the pattern on the wafer W as an inspection item for the wafer W after plasma etching from the image data of the wafer W after plasma etching. The three-dimensional shape of the pattern is, for example, a three-dimensional shape of a line of a line pattern.

For the calculation of the three-dimensional shape, a plurality of light sources emitting lights having different wavelengths may be provided in the imaging module IM. Then, image data of the wafer W may be acquired for each light with its corresponding wavelength, and a three-dimensional shape may be acquired based on the acquisition result.

<Other Modifications>

In the above embodiment, the imaging module IM is configured to perform imaging on the wafer W located in atmospheric pressure. Instead, the imaging module IM may be configured to perform imaging on the wafer W located in a decompressed atmosphere. In this case, the imaging module IM is provided, for example, at a position of any one of the etching modules PM1 to PM12 of FIG. 1. In the case described above, the imaging module IM may have a configuration similar to that of FIGS. 2 and 3, and when the imaging device 130 is difficult to accurately operate in the decompressed atmosphere, the imaging device 130 may be disposed outside the casing 110, and the imaging device 130 may perform imaging on the wafer W in the casing 110 through an optical window provided on a sidewall of the casing 110 or the like.

The disclosed embodiments are to be considered in all respects as illustrative and not restrictive. The above embodiments may be omitted, replaced, or changed in various forms without departing from the appended claims and the gist thereof.

The invention claimed is:

1. A method of inspecting a substrate in an etching system including an imaging device, the method comprising:
   (A) imaging the substrate after plasma etching with the imaging device to acquire image data; and
   (B) calculating, based on the image data of the substrate after plasma etching, at least one selected from a group consisting of a dimension of a pattern on the substrate after plasma etching, information on a defect on the substrate after plasma etching, a thickness of a film on the substrate after plasma etching, and information on an appearance of the substrate after plasma etching,
   wherein the method further comprises automatically performing;
   the step (A) for an inspection substrate; and
   (E) inspecting the inspection substrate based on the image data of the inspection substrate after plasma etching.

2. The method of claim 1, further comprising:
   determining a result of the plasma etching based on the information on the substrate after the plasma etching obtained in the step (B).

3. The method of claim 1, wherein the image data of the substrate after plasma etching used in the step (B) is corrected.

4. The method of claim 1, wherein the step (B) further includes calculating a three-dimensional shape of the pattern on the substrate after plasma etching.

5. The method of claim 1, wherein a timing of performing the steps of (A) and (E) for the inspection substrate is determined based on at least one selected from a group consisting of a predetermined frequency, a maintenance execution situation, and a plasma etching history for a product substrate.

6. The method of claim 1, further comprising:
   (C) imaging the substrate with the imaging device to acquire image data before the plasma etching; and
   (D) calculating, based on the image data of the substrate before plasma etching, at least one selected from a group consisting of the dimension of the pattern on the substrate before plasma etching, information on the defect on the substrate before plasma etching, the thickness of the film on the substrate before plasma etching, and information on the appearance of the substrate before plasma etching.

7. The method of claim 6, further comprising:
   determining whether the substrate before plasma etching needs to be inspected,
   wherein the steps (C) and (D) are performed when it is determined that the substrate before plasma etching needs to be inspected.

8. The method of claim 6, wherein the image data of the substrate before plasma etching used in the step (D) is corrected.

9. The method of claim 6, wherein the step (D) further includes calculating a three-dimensional shape of the pattern on the substrate before plasma etching.

10. A method of inspecting a substrate, the method comprising:

(a) calculating, based on image data of the substrate after plasma etching acquired in an etching system including an image device, at least one selected from a group consisting of a dimension of a pattern on the substrate after plasma etching, information on a defect on the substrate after plasma etching, a thickness of a film on the substrate after plasma etching, and information on an appearance of the substrate after plasma etching, wherein the method further comprises automatically performing:
  imaging, by the image device, an inspection substrate after plasma etching to acquire image data of the inspection substrate; and
  inspecting the inspection substrate based on the image data of the inspection substrate after plasma etching.

11. The method of claim 10, further comprising:
determining a result of the plasma etching based on the information on the substrate after the plasma etching obtained in the step (a).

12. The method of claim 10, wherein the image data of the substrate after plasma etching used in the step (a) is corrected.

13. The method of claim 10, wherein the step (b) further includes calculating a three-dimensional shape of the pattern on the substrate after plasma etching.

14. The method of claim 10, further comprising:
(b) calculating, based on image data of the substrate before the plasma etching acquired in the etching system, at least one selected from a group consisting of the dimension of the pattern on the substrate before plasma etching, information on the defect on the substrate before plasma etching, the thickness of the film on the substrate before plasma etching, and information on the appearance of the substrate before plasma etching.

15. The method of claim 14, further comprising:
determining whether the substrate before plasma etching needs to be inspected,
wherein the step (b) is performed when it is determined that the substrate before plasma etching needs to be inspected.

16. The method of claim 14, wherein the image data of the substrate before plasma etching used in (b) is corrected.

17. The method of claim 14, wherein the step (b) further includes calculating a three-dimensional shape of the pattern on the substrate before plasma etching.

* * * * *